(12) United States Patent
Bonnet et al.

(10) Patent No.: US 9,619,975 B2
(45) Date of Patent: Apr. 11, 2017

(54) TERMINAL CASING EQUIPPED WITH A REMOVABLE HATCH HAVING A CURVILINEAR PROFILE

(71) Applicant: INGENICO GROUP, Paris (FR)

(72) Inventors: Eric Bonnet, Malissard (FR); Olivier Yernaux, Romans-sur-Isere (FR)

(73) Assignee: INGENICO GROUP, Paris (FR)

( * ) Notice: Subject to any disclaimer, the term of this patent is extended or adjusted under 35 U.S.C. 154(b) by 0 days.

(21) Appl. No.: 14/931,435

(22) Filed: Nov. 3, 2015

(65) Prior Publication Data

US 2016/0125704 A1 May 5, 2016

(30) Foreign Application Priority Data

Nov. 3, 2014 (FR) ...................................... 14 60553

(51) Int. Cl.
*G07G 1/00* (2006.01)
*G07G 1/12* (2006.01)
(Continued)

(52) U.S. Cl.
CPC ......... *G07G 1/0018* (2013.01); *G07F 7/0873* (2013.01); *G07G 1/12* (2013.01); *H05K 5/0013* (2013.01); *G07G 1/0081* (2013.01)

(58) Field of Classification Search
CPC ...... G07G 1/0018; G07G 1/12; G07G 1/0081; G07F 7/005; G07F 7/02; G07F 7/0886;
(Continued)

(56) References Cited

U.S. PATENT DOCUMENTS 6,992,901 B1 * 1/2006 Hung ................... H05K 9/0009
174/385
2006/0181841 A1 * 8/2006 Chen ................... H04M 1/0266
361/679.3
(Continued)

FOREIGN PATENT DOCUMENTS

EP          1128347 A1    8/2001
EP          2101280 A1    9/2009
WO     2011/080117 A1    7/2011

OTHER PUBLICATIONS

English translation of the French Written Opinion Dated Oct. 6, 2015, for French Application No. 1460553, filed on Nov. 3, 2014.
(Continued)

*Primary Examiner* — J. Gregory Pickett
*Assistant Examiner* — Brijesh V. Patel
(74) *Attorney, Agent, or Firm* — David D. Brush; Westman, Champlin & Koehler, P.A.

(57) ABSTRACT

A terminal casing includes an one upper cover and one lower cover making a housing that can be closed by a removable hatch having a curvilinear profile. The hatch includes grooves distributed longitudinally on two parallel faces following the curvilinear profile. The lower cover includes tabs distributed longitudinally on two parallel faces in following the curvilinear profile, each tab cooperating with an associated groove. The tabs and the grooves are shaped to enable: through a translational motion followed by a rotational motion of the hatch, an insertion and a guidance of the tabs in the grooves of the hatch, when the hatch is inserted into the lower cover; and through a rotational motion followed by a translational motion of the hatch, a guidance of the tabs in the grooves of the hatch and a withdrawal of the tabs from the grooves when the hatch is withdrawn from the cove.

9 Claims, 5 Drawing Sheets

Figure 1A:
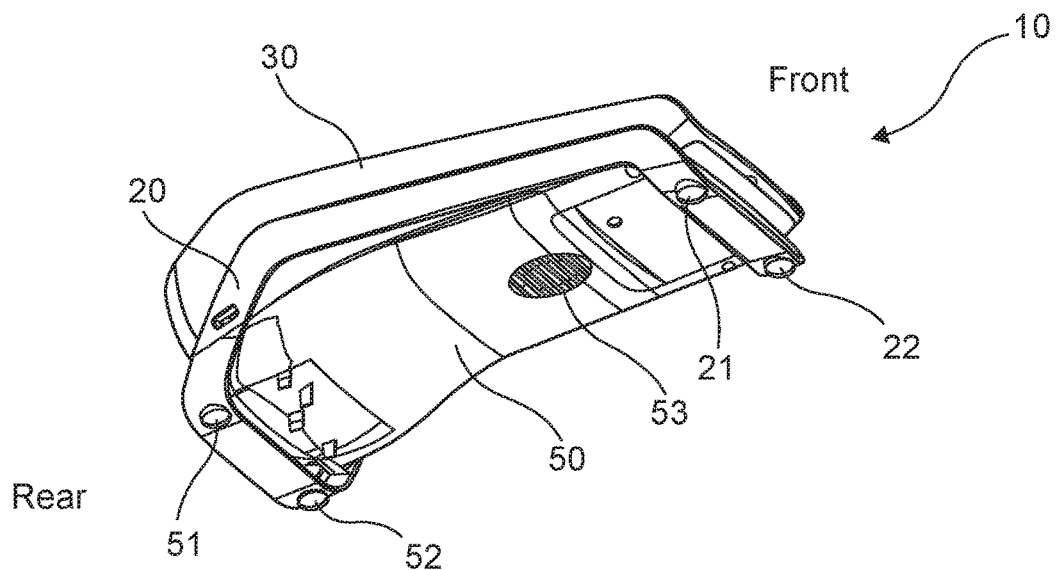

(51) Int. Cl.
*H05K 5/00* (2006.01)
*G07F 7/08* (2006.01)

(58) Field of Classification Search
CPC .... G06Q 20/20; G06Q 20/204; G06Q 20/343;
G06Q 50/12; G06Q 90/00
USPC .......... 220/4.01–4.02, 4.27; 235/145 R, 380,
235/383, 483, 485; 200/5 A, 512, 517,
200/61.93; 340/652; 361/679.26, 679.41
See application file for complete search history.

(56) References Cited

U.S. PATENT DOCUMENTS

2011/0248860 A1* 10/2011 Avital .................. H05K 1/0275
340/652
2012/0018288 A1* 1/2012 Rollet ..................... G06F 21/83
200/5 A

OTHER PUBLICATIONS

French Search Report and Written Opinion Dated Oct. 6, 2015, for French Application No. 1460553, filed on Nov. 3, 2014.

* cited by examiner

TERMINAL CASING EQUIPPED WITH A REMOVABLE HATCH HAVING A CURVILINEAR PROFILE

1. FIELD OF THE DISCLOSURE

The field of the disclosure is that of terminal casings and more particularly casings of electronic payment terminals.

The disclosure relates more specifically to a terminal casing equipped with a removable hatch having a curvilinear profile.

2. TECHNOLOGICAL BACKGROUND

We shall strive more particularly here below in this document to describe the problems and issues in the field of electronic payment casings that have been faced by the inventors of the present patent application. The present disclosure is of course not limited to this particular field of application but holds interest for any communications terminal casing that has to cope with proximate or similar problems and issues.

Present-day casings of electronic payment terminals generally have two parts, known as a lower cover and an upper cover, used to shelter all the operating components and elements of the terminal (electronic components, paper roll for printer, etc.).

The lower cover comprises a housing that can be closed by means of a removable protection hatch. Such a housing is used to house elements of the terminals such as for example a battery, a smartcard, connections for a connection cables of the terminal or a transactional storage module. This module, especially, is dedicated to the recording of transactions made by the terminal so as to include therein cash register functions, transaction logging functions, etc.

Conventionally, the protection hatch is fixed to the lower cover by means of a plurality of attachment screws or force-fitting mechanisms.

One of the main concerns of manufacturers is that of designing and manufacturing electronic payment terminals that are compact, have high mechanical resistance and are very simple to use.

Now, the drawbacks related to the presence of attachment screws include the lack of space available to position these screws and the fact that they increase the thickness of the terminal. Indeed, present-day casings have to adapt to the reduced terminal size demanded by users which imposes especially dimensional and ergonomic constraints.

Another drawback related to the use of attachment screws is that they make the operations for mounting and dismounting the hatch relatively lengthy and painstaking, because of the need to use a suitable tool (a screwdriver for example).

As for force-fitting mechanisms, they have the drawback of being fragile in their use and of making the operations for opening and closing the hatch difficult and painstaking.

The manufacturers have also devised a system of assembly based on a sliding of the hatch on the lower cover by means of guide rails. These guide rails enable a movement of rectilinear translation of the hatch relative to the lower cover, in a first direction to carry out the mounting (or closing) of the hatch or, in a second direction, to carry out the dismounting (or opening) of the hatch.

This type of system can only be compatible with hatches having a rectilinear surface profile. However, most of the presently designed casings have a curvilinear surface profile, especially to meet the ergonomic constraints for installing a hatch with a curvilinear surface profile.

3. SUMMARY

One particular embodiment of the disclosure proposes a terminal casing comprising at least one upper cover and one lower cover in which there is made a housing that can be closed by means of a removable hatch having a curvilinear profile. The hatch, or the lower cover, comprises a plurality of grooves distributed longitudinally on at least two parallel faces in following said curvilinear profile, the lower cover, or the hatch respectively, comprises a plurality of tabs distributed longitudinally on at least two parallel faces in following said curvilinear profile, each tab being designed to cooperate with an associated groove. The tabs and the grooves are shaped so as to enable:

through a first combination of motions comprising a translational motion followed by a rotational motion of the hatch, an insertion and a guidance respectively of the tabs in the grooves, when the hatch is inserted into the lower cover, through at least one second combination of motions comprising a rotational motion followed by a translational motion of the hatch, a guidance of the tabs in the grooves and a withdrawal of the tabs from the grooves respectively when the hatch is withdrawn from the cover.

Thus, an embodiment of the disclosure relies on a novel implementation of a terminal casing enabling the easy mounting and dismounting of a removable hatch with curvilinear profile and of the upper cover.

Thus, one or more of the embodiments of the disclosure optimizes the operations of assembly and dismantling of the removable hatch relative to the lower cover of the casing in using grooves and tabs that are ingeniously distributed on the hatch (or the lower cover) and the lower cover (or the hatch) respectively, and cooperate together so as to allow an insertion and a guidance of the tabs in the grooves when the hatch is inserted into the cover according to a first combination of motions, and a withdrawal and a guidance of the tabs in the grooves when the hatch is withdrawn from the cover according to a second combination of motions of the hatch relative to the cover. Such combinations of motions based on translation and rotation are natural for the user and greatly facilitate the handling of the hatch with curvilinear profile, for example during the maintenance of the casing.

In addition, the tabs and grooves according to the disclosure remove the need to use attachment screws, which would make the operations of opening and closing the hatch painstaking. At the same time, these tabs and grooves ensure efficient closure of the hatch on the cover. Indeed, since these tabs and grooves are made out of an elastically deformable material, they have a certain flexibility that prevents breakage and prevents the hatch from opening unexpectedly, during a fall for example, unlike the attachment screws which deteriorate during a fall (because the parts around the screws break or get cracked). Besides, these tabs and grooves are easier to devise during the phases for designing the casing than screw attachments, since the parts to be devised can molded out of an elastically deformable material (a polymer for example) whereas screws, which are commercially procured elements, are more difficult to modify.

According to one particular aspect of the disclosure, the hatch has a direction of insertion and a direction of withdrawal opposite to the direction of insertion. For each face of the hatch, or the lower cover, the grooves are each tilted relative to said curvilinear profile by an angle of tilt that increases in the direction of withdrawal of the hatch and decreases in the direction of insertion of the hatch. For each face of the cover, or the hatch, the tabs are each tilted relative to said curvilinear profile by an angle of tilt that increases in the direction of withdrawal of the hatch and decreases in the direction of insertion of the hatch.

In other words, the rotational motion of the hatch relative to the lower cover is done about a center of rotation common to all the tabs (or all the grooves) but along different radii of curvature according to the position of the tab (or groove): the radius of curvature increases in the direction of withdrawal of the hatch and decreases in the direction of insertion of the hatch.

In this way, the forces brought into play when the hatch is placed on the cover increase as and when the user inserts the hatch in the cover, providing for high stability of the hatch at the end of its travel. Conversely, the forces brought into play during the withdrawal of the hatch decrease rapidly, thus providing for an easy and natural withdrawal of the hatch.

According to one particular characteristic, each groove of the plurality comprises:

an insertion portion enabling an insertion in translation of the tab associated with said groove, in said groove, and a guiding portion enabling a guidance in rotation of said tab in said groove.

Thus, the grooves provided in the hatch each comprise an insertion portion, configured to enable a docking in translation of the hatch in a first stage, and a guiding portion configured to enable guidance in rotation of the hatch in a second stage, when it is transferred to the lower cover and vice versa.

According to one particular characteristic, each groove substantially takes the shape of an longitudinally reclining L, with a lateral part and a longitudinal part, said lateral part forming the insertion portion and said longitudinal part forming the guiding portion.

According to one particular characteristic, each tab takes the shape of a parallelepiped.

According to one particular aspect of the disclosure, the grooves are placed on lateral faces of the hatch, or the lower cover, and the tabs are placed on lateral faces of the cover, or the hatch respectively.

According to one particular aspect of the disclosure, the grooves are distributed with homogenous spacing (equidistant for example) on the lateral faces of the hatch (or the lower cover) and the tabs are distributed with homogenous spacing (equidistant for example) on the lateral faces of the cover (or the hatch), corresponding to the spacing of the grooves of the hatch (or the lower cover).

Such a configuration enables a balanced distribution of the forces exerted on the grooves and the tabs when the casing falls. It also makes it possible to form the hatch on the cover (to compensate for any deformation of the hatch during molding).

According to one particular characteristic, the terminal casing comprises a reversible lock for reversibly locking the hatch to the lower cover, constituted by at least one elastically flexible longitudinally oriented coupling toe on one front end of the hatch, cooperating with at least one notch for receiving said at least one coupling toe, made in the lower cover.

Thus, the lock according to an embodiment of the disclosure is configured so as to enable an elastic holding of the hatch to the lower cover but are releasable when a compressive force perpendicular to the curvilinear profile is exerted in proximity to said front end of the hatch so that the hatch passes from a locked position to an unlocked position.

Through the reversible lock, an embodiment of the disclosure provides for the possibility of carrying out:

a "locking" of the hatch at the end of travel by simply clipping on the coupling toe in the corresponding receiving notch, thus fixedly attaching the hatch and the lower cover when the hatch is transferred to the cover, and an "unlocking" of the hatch by simple pressure on the hatch to disengage the coupling toe from the corresponding reception notch, thus enabling the withdrawal of the hatch from the casing.

According to one alternative embodiment, the hatch comprises a push-button that is mobile in translation, cooperating with the at least one coupling toe that is mobile in translation, said at least one coupling toe being oriented longitudinally on a front end of the hatch, cooperating with the at least one reception notch of said at least one coupling toe made in the lower cover.

This variant makes it possible for the operator to carry out a very simple and very practical mounting and dismounting operation.

According to one particular characteristic, the hatch comprises a bow-shaped portion at its rear end shaped so as to ensure a locking of at least one connector situated behind the lower cover.

The connector is then sandwiched between the bow-shaped portion of the hatch and the rear of the lower cover, thus fixedly attaching it to the hatch and the cover.

4. LIST OF FIGURES

Figure 1B:
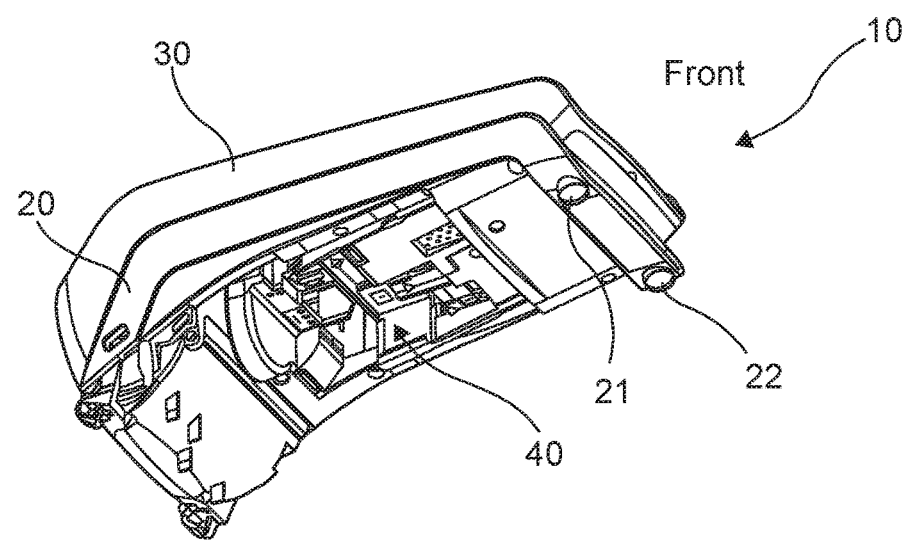
Figure 3A:
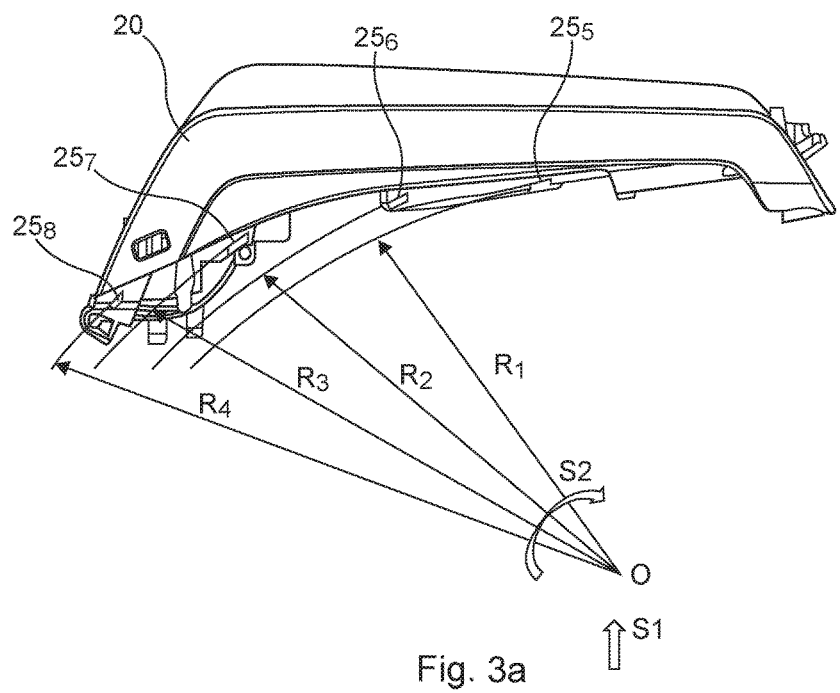
Figure 3B:
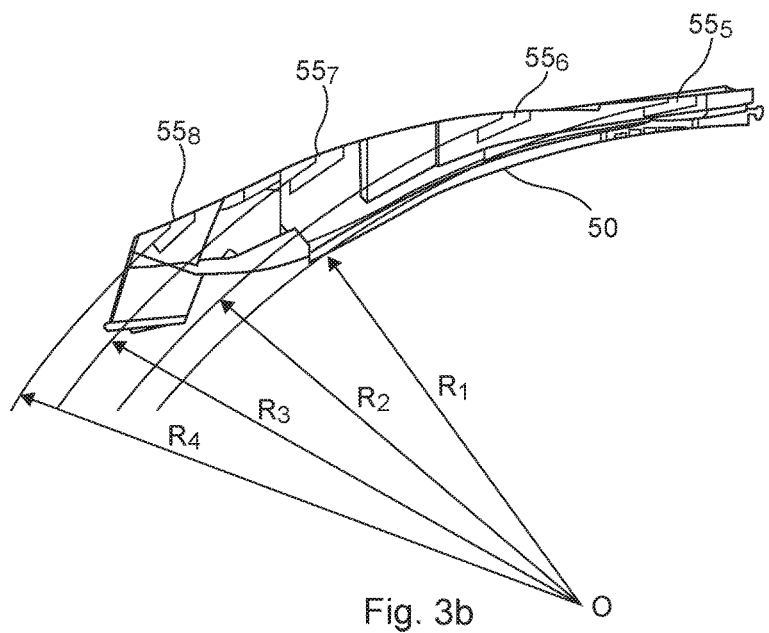
Figure 3C:
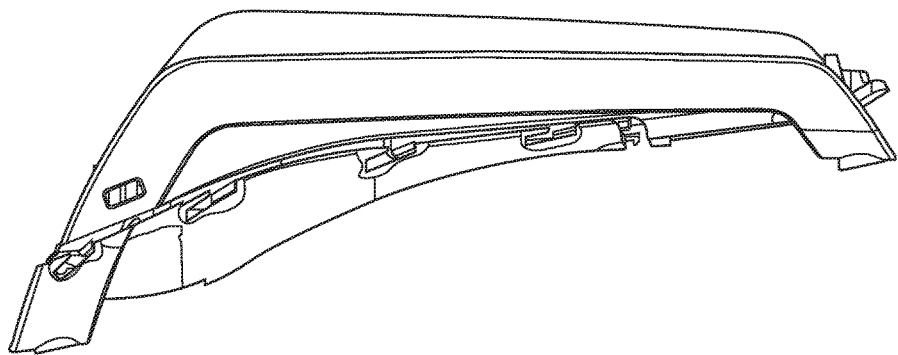
Figure 3D:
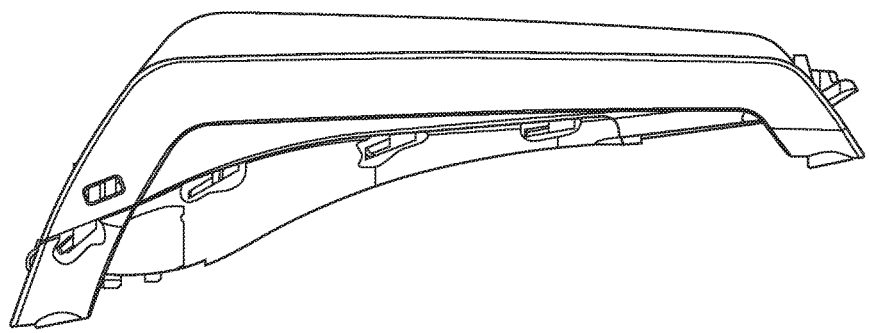
Figure 4:
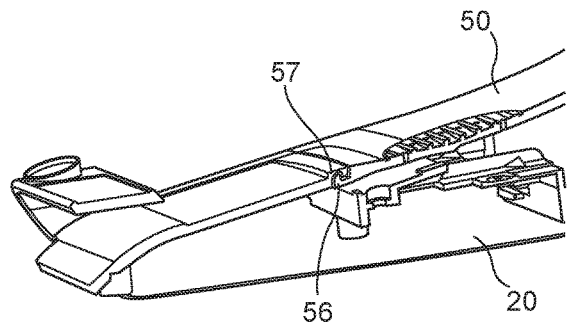
Figures 5, 6:
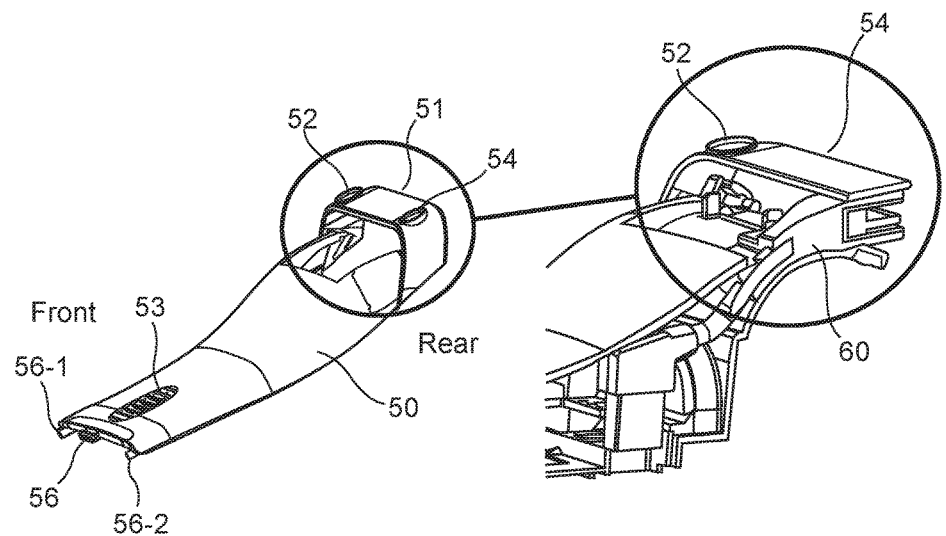

Other features and advantages shall appear from the following description, given by way of an indicative and non-limiting example and from the appended drawings, of which:

FIGS. 1a and 1b each present a bottom view in perspective of a payment terminal casing according to one particular embodiment of the disclosure, FIG. 1a illustrating the casing with the presence of a hatch and FIG. 1b illustrating the casing in the absence of a hatch;

FIGS. 2a, 2b, 3a and 3b schematically illustrate the principle of the mounting and dismounting of a removable hatch on the lower cover of terminal casing according to one particular embodiment of the disclosure;

FIGS. 3c and 3d present the removable hatch respectively in the "engaged" position engaged in the lower cover and in a closed position according to one embodiment of the disclosure;

FIG. 4 presents a detailed perspective view of one end of the lower cover after the hatch has been transferred to this cover;

FIG. 5 presents a view in perspective from below of the hatch illustrated in FIGS. 2a, 2b, 3a and 3b;

FIG. 6 presents a partial perspective view in section of the hatch once mounted on the lower cover of the casing, illustrating the presence of a connector of the terminal sandwiched between the hatch and the lower cover of the casing.

5. DETAILED DESCRIPTION

In all the figures of the present disclosure, the identical elements and steps are designated by a same numerical reference.

According to one particular embodiment of the disclosure, illustrated in FIGS. 1a and 1b, the casing 10 of the payment terminal is constituted by an upper cover 30 and a lower cover 20 attached to each other by attachment screws or a hinged attachment for example.

The lower cover 20 comprises a housing 40 which can be closed by means of a removable protective hatch referenced 50.

The housing 40 is designed to receive elements of the terminal such as for example a battery, a smartcard, an electronic module and/or a connection cables.

Owing to the generally curvilinear profile of the lower cover 20 on which the hatch 50 is to be mounted, the hatch 50 has a curvilinear surface profile (the term "curvilinear plane profile" is also used). This is clearly illustrated in FIG. 4.

The casing 10 furthermore has a card-insertion slot (not shown) in the front of the casing and a printing-paper outlet slot (not shown) in the rear of the casing.

Two rubber pads 21, 22 are also provided on the under face of the lower cover 20 in the front of the casing 10 and two rubber pads 51, 52 are provided on the under face of the hatch 50 in the rear of the casing 10. These four rubber pads 21, 22, 51, 52 provide for the maintenance and stability of the casing 10 when it is placed on a support such as a table or a counter for example. Naturally, this is an example of an embodiment and it is possible to envisage other variants fulfilling the same function. For example, it is possible to consider replacing the two pads 21, 22 by a single, larger-sized rubber pad.

Figure 2A:
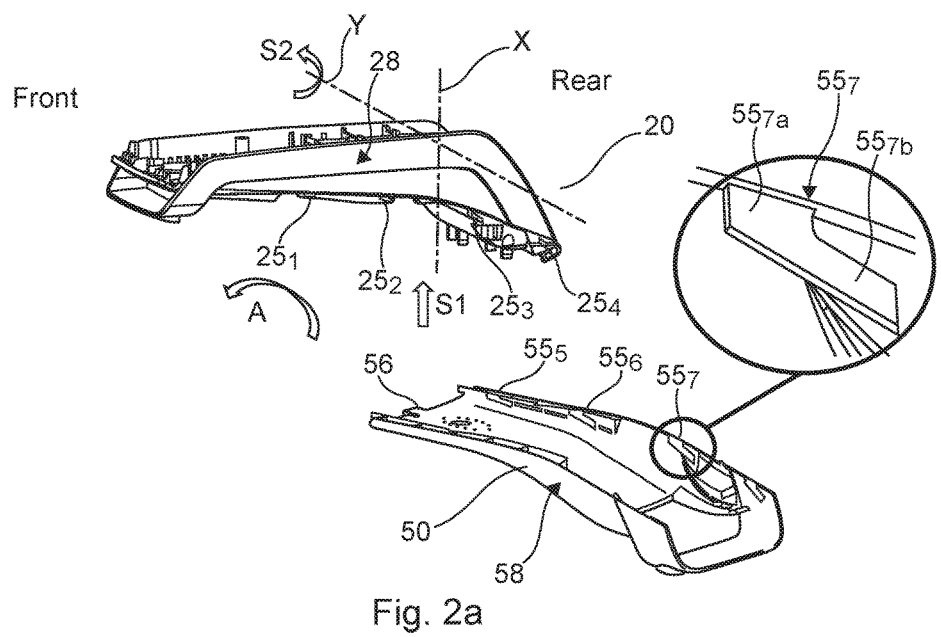
Figure 2B:
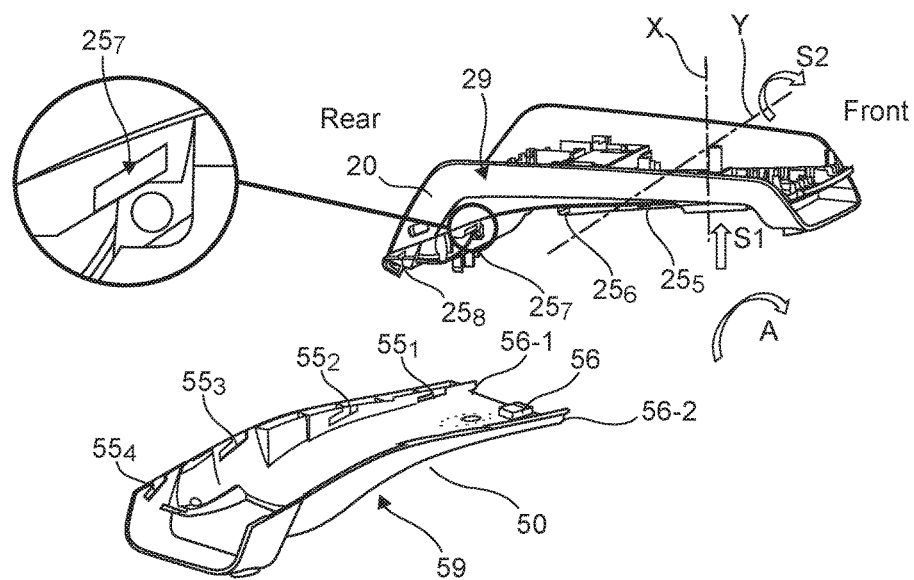

FIGS. 2a, 2b, 3a and 3b schematically illustrate the principle of the mounting and dismounting of the hatch 50 and of the lower cover 20 of a terminal casing according to one particular embodiment of the disclosure. FIG. 2a represents a first side view and FIG. 2b represents a second side view of the hatch 50 and of the lower cover 20.

The hatch 50 has a set of eight side grooves $55_1$ to $55_8$ distributed longitudinally on the lateral faces 58 and 59 of said hatch along the curvilinear surface profile. The lateral face 58 comprises the four grooves $55_1$ to $55_4$ and the lateral face 55 comprises the four grooves $55_5$ to $55_8$.

The lower cover 20 has a set of eight lateral tabs (or teeth) $25_1$ to $25_8$ distributed longitudinally on the lateral faces 28 and 29 of said cover in following the curvilinear surface profile. The side face 28 comprises the four tabs (or teeth) referenced $25_1$ to $25_4$ and the lateral face 29 comprises the four tabs referenced $25_5$ to $25_8$. The tabs $25_1$ to $25_8$ of the cover are designed to cooperate with grooves $55_1$ to $55_8$ of the hatch respectively. The set of lateral tabs $55_1$ to $55_8$ and the set of grooves $55_1$ to $55_8$ more generally forms a guide of the hatch on the lower cover.

The arrow symbolized by the letter "A" represents the overall direction of insertion of the hatch 50 into the lower cover 20. The direction opposite to this direction of insertion corresponds to the direction of withdrawal of the hatch 50 from the lower cover 20.

Each groove made in the hatch 50 substantially has the shape of an L reclining longitudinally in the direction of withdrawal of the hatch, with a lateral part and a longitudinal part. Let us take for example the groove $55_7$, illustrated in close-up in FIG. 2a. The side part $55_{7a}$ of the groove $55_7$, situated on the edge of the lateral face (on the hatch transfer side) forms an insertion portion enabling an insertion of the tab $25_7$, associated with it, in the groove $55_7$. The longitudinal part $55_{7b}$ forms a guiding portion enabling a guiding of the tab $25_7$ in the groove $55_7$, when the hatch 50 is inserted into the lower cover 20 up to an end-of-travel position.

On the lateral face 58 of the hatch, the grooves $55_1$ to $55_4$ are tilted by an angle of tilt which decreases in the direction of insertion (arrow A) of the hatch 50 (i.e. from the rear to the front of the cover) and, conversely, increases in the direction of withdrawal of the hatch 50 (i.e. from the front to the rear of the cover). On the later face 59 of the hatch, the grooves $55_5$ to $55_8$ are tilted by an angle of tilt that decreases in the direction of insertion (arrow A) of the hatch 50 (i.e. from the rear to the front of the cover) and conversely increasing in the direction of withdrawal of the hatch 50 (i.e. from the front to the rear of the cover).

On the lateral face 28 of the cover, the tabs $25_1$ to $25_4$ have an identical decreasing angle of tilt relative to the associated grooves $55_1$ to $55_4$ on the hatch. On the lateral face 29 of the hatch, the tabs $25_5$ to $25_8$ have a decreasing angle of tilt that is identical to the associated grooves $55_5$ to $55_8$ on the hatch.

The tabs $25_1$-$25_8$ in this embodiment each take the form of a parallelepiped. This form is particularly well suited to facilitating the insertion and guidance of the tabs in corresponding grooves having a reclining L shape.

Mounting the Hatch and the Lower Cover

The hatch 50 is transferred to the lower hatch 20 by means of a combination of motions comprising a translational motion and a rotational motion.

As illustrated in FIGS. 3a and 3b, the hatch 50 is inserted, in a first stage, into the lower hatch 20 by means of a translational motion of the hatch relative to the cover in such a way that the tabs ($25_5$ to $25_8$) of the hatch get inserted into the insertion portions ($55_{5a}$ to $55_{8a}$) made in the hatch. This translational motion achieves a "docking" of the hatch with the cover 20. As illustrated in FIG. 3c, the hatch is situated in the "engaged" position on the lower cover after docking.

In a second stage, the hatch 50 is guided in the cover by means of a rotational motion of the hatch relative to the cover in such a way that the tabs ($25_5$ to $25_8$) are guided in rotation in the corresponding guidance portions ($55_{5b}$ to $55_{8b}$) made in the hatch 50 until the hatch is again in a locked position, as illustrated in FIG. 3d (the principle of locking of the hatch at the end of travel is described in detail further below with reference to FIG. 4).

The angle of tilt of the tabs and of the grooves is chosen so as to enable an insertion of the hatch 50 in the lower cover 20 by means of a rotation about a common virtual axis of rotation 0 according to different radii of curvature depending on the tab/groove pair concerned. In particular, the tabs and grooves have radii of curvature that decrease in the direction of insertion of the hatch. The radii $R_1$, $R_2$, $R_3$, $R_4$ are respectively associated with the pairs $25_5/50_5$, $25_6/50_6$, $25_7/50_7$, $25_8/50_8$, $R_1$, being the smallest radius of curvature and $R_4$ being the greatest radius of curvature.

Thus, because of the layout and the shape of the tabs and the grooves, the transfer of the hatch 50 to the lower cover 20 is done, on the one hand by means of a translational motion along the vertical axis X (in the direction of the arrow S1), allowing the hatch 50 to dock with the lower cover 20 and, on the other hand, by means of a rotational motion about the transversal axis of the cover Y (in the direction of the arrow S2) allowing a guidance of the hatch 50 in the lower cover 20. In other words, the axis of insertion of the hatch 50 into the lower cover 20 is modified during its insertion to enable compliance with the curvilinear profile of the hatch 50.

Dismounting the Hatch and the Lower Cover

The hatch is dismounted from the lower cover 20 by a combination of motions that are the reverse of those used for the mounting and comprise a motion of rotation followed by a motion of translation.

After the hatch 50 is unlocked (the principle of unlocking is described in detail further below with reference to FIG. 4), the hatch 50 is guided in the lower cover by means of a rotational motion of the hatch relative to the cover in such a way that the tabs ($25_5$ to $25_8$) are guided in rotation in the guidance portions ($55_{5b}$ to $55_{8b}$) of the hatch 50. The angle of tilt of the tabs and of the grooves is chosen so as to enable a guidance of the hatch 50 by means of a rotation about a common virtual axis of rotation 0 along the radii of curvature $R_1$, $R_2$, $R_3$, $R_4$ respectively associated with the pairs $25_5/50_5$, $25_6/50_6$, $25_7/50_7$, $25_8/50_8$. The rotational motion is done in reverse to the direction of the arrow S2. Once the tabs ($25_5$ to $25_8$) have been placed in the corresponding insertion portions ($55_{5a}$ to $55_{8a}$), a translational motion of the hatch relative to the cover in the reverse direction of the direction of the arrow S1 is made in such a way that the tabs ($25_5$ to $25_8$) of the cover get disengaged from the insertion portions ($55_{5a}$ to $55_{8a}$) made in the hatch, so that the hatch is withdrawn from the cover. Thus, the axis of withdrawal of the hatch 50 from the lower cover 20 is modified during its withdrawal to enable the curvilinear profile of the hatch 50 to be complied with.

Such a combination of translational and rotational motions, whether for the mounting of the hatch 50 (insertion by means of a translation and then a rotation) or its dismounting (withdrawal by means of rotation and then a translation), is natural for the operator and greatly facilitates the handling of the hatch with curvilinear profile and the cover, for example during maintenance work on the casing 10 (changing of elements included in the housing 40 of the lower cover 20 of the terminal such as the battery, smartcard, electronic module, connection cables, etc.).

It must be noted that the casing of the terminal according to an embodiment of the disclosure does not require any additional tools or equipment to carry out the operations of insertion and withdrawal, unlike in the use of attachment screws. Indeed, the tabs and grooves according to the disclosure remove the need for attachment screws which would make the operations of opening and closing the hatch painstaking while at the same time providing for an efficient closure of the hatch on the cover (especially through the decreasing tilt of the grooves in the direction of insertion of the hatch). In addition, these tabs and grooves according to the disclosure can be made out of elastically deformable materials, having a certain degree of flexibility and thus making it possible to avoid breakage. Besides, these tabs and grooves are easy to devise during the phases for designing the casing, since the parts to be devised can be made by molding using an elastically deformable material (a polymer for example) whereas the screws, which are commercially available elements, are more difficult to modify.

It must also be noted that the grooves $25_1$-$25_8$ made in the hatch 50 are distributed on the lateral faces 28 and 29 with homogenous spacing such as for the tabs $55_1$-$55_8$ of the lower cover which are distributed on the lateral faces with corresponding equidistant spacing. This makes it possible to distribute the forces on the parts and thus prevent deformation or even a breakage of the parts. Naturally, a different layout of the tabs and grooves could be envisaged without departing from the framework of the disclosure.

In the embodiment represented in these figures, the hatch contains a set of eight grooves (i.e. four grooves per face) and the lower cover contains a set of eight tabs (namely four tabs per face). This is an illustrative example and it is possible to plan for a greater or a smaller number of tabs and grooves without departing from the framework of the disclosure. A greater number of tabs and grooves can be envisaged for example if it is desired to strengthen the resistance of the casing to falls or else quite simply depending on the design of the casing.

The terminal casing 10 furthermore comprises a reversible lock for reversibly locking the hatch 50 to the lower cover 20. In the example illustrated in FIGS. 4 and 5, the lock is constituted by a coupling toe 56 and two guidance toes 56-1, 56-2.

The coupling toe 56 is elastically flexible and oriented longitudinally on the free (or unattached) front end of the hatch 50, cooperating with a reception notch 57 made in the lower cover 20 of the casing. The coupling toe 56 and the corresponding reception notch 57 are configured so that the hatch can be elastically held to the lower cover, giving the hatch a locked position (at the end of a travel when the tabs are plunged into the corresponding guiding portions), releasable when a pressing force is exerted appreciably perpendicularly to the surface of the hatch and in proximity to the front end of the hatch in such a way that the hatch passes from the locked position to an unlocked position. The pressure zone 53 for example can be dedicated to a function of locking/unlocking the hatch 50.

The guidance toes 56-1 and 56-2 guide the hatch 50 at the end of its travel each cooperating with an associated reception notch.

Thus, lock provides for a "locking" of the hatch 50 at the end of travel during its insertion into the cover 20 by the simple "clipping on" of the coupling toe 56 in the notch 57 making the hatch 50 fixedly attached to the lower cover 20 when the hatch 50 is attached to the cover 20. Since the lock is reversible, the lock furthermore makes it possible to "unlock" the hatch 50 by simple pressure on the pressure zone 53 so as to disengage the coupling toe 56 from its reception notch 57, thus allowing the withdrawal of the hatch 50 from the lower cover 20.

The reversible lock is thus designed to enable a locking and an unlocking of the hatch by means of the pressure of a single finger (on the dedicated pressure zone 53). Thus, the hatch can be put in place and removed ergonomically.

According to one alternative embodiment, the pressure zone can be replaced by a mobile push-button that is mobile in translation and cooperates with the coupling toe 56 which is also mobile in translation, to enable the locking and unlocking of the hatch 50 to the terminal 10 by simple manual pressure on the button.

Advantageously, the hatch 50 furthermore comprises a bow-shaped (or loop-shaped) portion 54 at its rear end. As illustrated in a close-up in FIG. 6, this bow-shaped portion 54 is shaped so as to provide for locking or blocking of at least one connector 60 situated in the rear of the lower cover. Thus, once the hatch 50 has been inserted and locked into the lower cover 20, the connector 60 is sandwiched between the bow-shaped portion 54 of the hatch and the rear of the lower cover 20, making it fixedly attached to the hatch and the cover.

The embodiment described here above applies to electronic payment casings. It is clear however, that the disclosure is not limited to this particular application and can easily be adapted to other types of casings of communications terminals without departing from the framework of the disclosure.

The grooves and tabs (teeth) arrangement illustrated in the particular embodiment of the disclosure described above in relation with FIGS. 1 to 6 is such that the grooves and tabs are distributed on lateral faces of the hatch and the lower cover respectively. Of course, this is a particular example of arrangement of grooves and tabs. Alternatively, one can envisage to have the grooves and tabs (teeth) distributed on the lateral faces of the lower cover and the hatch respectively, without departing from the scope of the disclosure (the principal of the disclosure described above in relation with FIGS. 1 to 6 remaining the same, only the type of guidance elements (tabs or grooves) being inverted).

An exemplary embodiment of the present disclosure provides a terminal casing that can be used to easily mount and dismount a hatch with a curvilinear surface profile while at the same time taking account of dimensional and ergonomic constraints.

An exemplary embodiment provides a terminal casing that takes account of the constraints related to the thickness and the curvilinear profile of the casing.

At exemplary embodiment provides a terminal casing that has high mechanical resistance, especially a casing that withstands falls.

Although the present disclosure has been described with reference to one or more examples, workers skilled in the art will recognize that changes may be made in form and detail without departing from the scope of the disclosure and/or the appended claims.

The invention claimed is:

1. A terminal casing comprising:
    at least one upper cover and one lower cover in which there is made a housing configured to be closed by a removable hatch having a curvilinear profile, wherein:
    the hatch, or the lower cover, comprises a plurality of grooves distributed longitudinally on at least two parallel faces along said curvilinear profile,
    the lower cover, or the hatch respectively, comprises a plurality of tabs distributed longitudinally on at least two parallel faces along said curvilinear profile, each tab of the plurality of tabs being designed to cooperate with an associated groove of the plurality of grooves,
    the hatch has a direction of insertion and a direction of withdrawal opposite to the direction of insertion,
    plurality of grooves of each face are each tilted relative to the curvilinear profile by an angle of tilt that increases in the direction of withdrawal of the hatch and decreases in the direction of insertion of the hatch, and
    the plurality of tabs of each face are each tilted relative to the curvilinear profile by an angle of tilt that increases in the direction of withdrawal of the hatch and decreases in the direction of insertion of the hatch.

2. The terminal casing according to claim 1, wherein each groove of the plurality comprises:
    an insertion portion enabling an insertion in translation of the tab associated with said groove, in said groove, and
    a guiding portion enabling a guidance in rotation of said tab in said groove.

3. The terminal casing according to claim 2, wherein each groove of the plurality of grooves substantially takes the shape of an L reclining longitudinally, with a lateral part and a longitudinal part, said lateral part forming the insertion portion and said longitudinal part forming the guiding portion.

4. The terminal casing according to claim 1, wherein each tab of the plurality of tabs takes the shape of a parallelepiped.

5. The terminal casing according to claim 1, wherein:
    the plurality of grooves are placed on lateral faces of the hatch, or the lower cover,
    the plurality of tabs are placed on lateral faces of the lower cover, or the hatch respectively.

6. The terminal casing according to claim 5, wherein the plurality of grooves are distributed with homogenous spacing on the lateral faces of the hatch, or the lower cover, and the plurality of tabs are distributed with homogenous spacing on the lateral faces of the cover, or the hatch respectively.

7. The terminal casing according to claim 1, comprising a reversible lock for reversibly locking the hatch to the lower cover, constituted by at least one elastically flexible, longitudinally oriented coupling toe on one front end of the hatch, cooperating with at least one notch for receiving said at least one coupling toe, made in the lower cover.

8. The terminal casing according to claim 1, wherein the hatch comprises a push-button mobile in translation, cooperating with at least one coupling toe mobile in translation, said at least one coupling toe being oriented longitudinally on a front end of the hatch, cooperating with at least one reception notch of said at least one coupling toe made in the lower cover.

9. The terminal casing according to claim 1, wherein the hatch comprises a bow-shaped portion at its rear end shaped so as to ensure a locking of at least one connector situated behind the lower cover.

* * * * *